(12) United States Patent
Kim

(10) Patent No.: US 10,741,254 B2
(45) Date of Patent: Aug. 11, 2020

(54) MEMORY SYSTEM AND OPERATING METHOD THEREOF

(71) Applicant: SK hynix Inc., Gyeonggi-do (KR)

(72) Inventor: Jin-Pyo Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/404,837

(22) Filed: May 7, 2019

(65) Prior Publication Data
US 2020/0126624 A1    Apr. 23, 2020

(30) Foreign Application Priority Data
Oct. 17, 2018  (KR) .......................... 10-2018-0123639

(51) Int. Cl.
*G11C 7/00* (2006.01)
*G11C 16/16* (2006.01)
*G06F 3/06* (2006.01)

(52) U.S. Cl.
CPC ............ *G11C 16/16* (2013.01); *G06F 3/0652* (2013.01); *G06F 3/0679* (2013.01)

(58) Field of Classification Search
CPC ...... G11C 16/16; G03F 3/0652; G03F 3/0679
See application file for complete search history.

(56) References Cited

U.S. PATENT DOCUMENTS

| 7,096,313 | B1 * | 8/2006 | Chang | G06F 12/0246 711/103 |
| 8,832,507 | B2 * | 9/2014 | Post | G06F 11/1048 714/718 |
| 10,466,902 | B2 * | 11/2019 | Shin | G06F 3/0665 |
| 2010/0058359 | A1 * | 3/2010 | Ferlitsch | G06F 13/102 719/321 |
| 2015/0052415 | A1 * | 2/2015 | Um | G06F 11/1056 714/768 |
| 2016/0196216 | A1 * | 7/2016 | Lee | G06F 3/0604 711/170 |
| 2017/0371572 | A1 * | 12/2017 | Lee | G06F 11/1466 |
| 2018/0101454 | A1 * | 4/2018 | Lee | G06F 3/0614 |
| 2019/0066800 | A1 * | 2/2019 | Lee | G06F 13/1642 |

FOREIGN PATENT DOCUMENTS

| KR | 10-2009-0014036 | 2/2009 |
| KR | 10-2017-0060204 | 6/2017 |

* cited by examiner

Primary Examiner — Toan K Le
(74) Attorney, Agent, or Firm — IP & T Group LLP

(57) ABSTRACT

A memory system includes a memory device suitable for storing an erase count list where a first erase count of each of a plurality of memory blocks is recorded, and a controller suitable for counting the first erase count of each of the memory blocks, updating the erase count list to reflect the first erase count, selecting victim blocks from the memory blocks, checking a second erase count corresponding to each of the victim blocks, updating a victim block erase count list to reflect the second erase count, comparing the first erase count and the second erase count which correspond to a target victim block, among the victim blocks, and moving data stored in the target victim block to a normal block when the first erase count is equal to the second erase count.

20 Claims, 15 Drawing Sheets

MEMORY SYSTEM AND OPERATING METHOD THEREOF

CROSS-REFERENCE TO RELATED APPLICATIONS

The present application claims priority under 35 U.S.C. § 119(a) to Korean Patent Application No. 10-2018-0123639 filed on Oct. 17, 2018, the disclosure of which is incorporated herein by reference in its entirety.

BACKGROUND

1. Field

Various embodiments of the present invention generally relate to a memory system. Particularly, the embodiments relate to a memory system capable of efficiently managing memory blocks, and an operating method thereof.

2. Description of the Related Art

The computer environment paradigm has shifted towards ubiquitous computing, which enables computing systems to be used anytime and anywhere. As a result, the demand for portable electronic devices, such as mobile phones, digital cameras, and laptop computers have increased rapidly. Those electronic devices generally include a memory system using a memory device as a data storage device. The data storage device may be used as a main memory unit or an auxiliary memory unit of a portable electronic device.

Since there is no mechanical driving part, a data storage device using a memory device provides advantages such as excellent stability and durability, high information access speed, and low power consumption. Also, the data storage device can have a higher data access rate and lower power consumption than a hard disk device. Non-limiting examples of the data storage device having such advantages include Universal Serial Bus (USB) memory devices, memory cards of diverse interfaces, Solid-State Drives (SSD), and the like.

SUMMARY

Various embodiments of the present invention are directed to a memory system capable of efficiently performing an erase operation and a read operation by managing erase counts corresponding to each of victim memory blocks.

In accordance with an embodiment of the present invention, a memory system may include: a memory device suitable for storing an erase count list where a first erase count of each of a plurality of memory blocks is recorded; and a controller suitable for counting the first erase count of each of the memory blocks, updating the erase count list to reflect the first erase count, selecting victim blocks from the memory blocks, counting the first erase count at the time of the selecting the victim blocks as a second erase count corresponding to each of the victim blocks, updating a victim block erase count list to reflect the second erase count, comparing the first erase count and the second erase count which correspond to a target victim block, which is detected to determine whether operation of moving data in a victim block to a normal block is necessary, among the victim blocks, and moving data stored in the target victim block to the normal block when the first erase count is equal to the second erase count, wherein the first erase count is a cumulative number of erase operations performed on each of the memory blocks up to the present, wherein the second erase count is a cumulative number of erase operations which had been performed on each of the victim blocks until the victim blocks are selected.

In accordance with an embodiment of the present invention, an operating method of a memory system may include: counting a first erase count of each of a plurality of memory blocks; updating the erase count list such that the first erase count corresponds to each of the memory blocks; selecting a victim block from the memory blocks; counting the first erase count at the time of the selecting the victim blocks as a second erase count corresponding to each of the victim blocks and updating a victim block erase count list to reflect the second erase count; comparing the first erase count and the second erase count which correspond to a target victim block, which is detected to determine whether moving data from a victim block to a normal block is necessary, among the victim blocks; and moving data stored in the target victim block to the normal block when the first erase count is equal to the second erase count, wherein the first erase count is a cumulative number of erase operations performed on each of the memory blocks up to the present, wherein the second erase count is a cumulative number of erase operations which had been performed on each of the memory blocks until the victim blocks are selected.

In accordance with an embodiment of the present invention, a memory system may include: a memory device including a normal memory block and a selected victim memory block; and a controller suitable for controlling the memory device to move, during a garbage collection operation, data from the victim memory block to the normal memory block when the victim memory block has not been erased since the victim memory block is selected.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
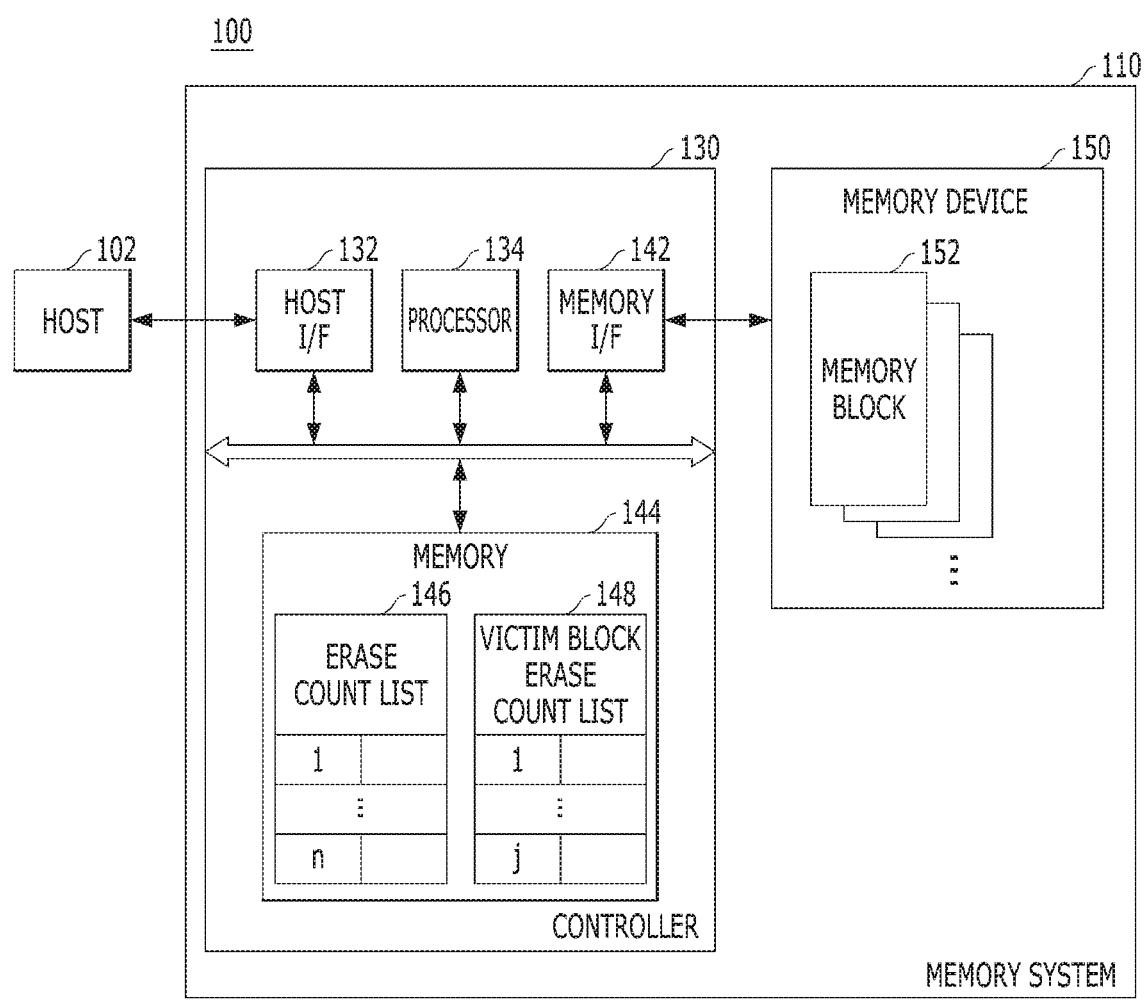
FIG. 1 is a block diagram illustrating a data processing system including a memory system in accordance with an embodiment of the present disclosure.

Various examples of the disclosure are described below in more detail with reference to the accompanying drawings. The disclosure may be embodied in different other embodiments, forms and variations thereof and should not be construed as being limited to the embodiments set forth herein. Rather, the described embodiments are provided so that this disclosure will be thorough and complete, and will fully convey the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. For example, a first element in one instance could also be termed as a second or third element in another instance, without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless the context indicates otherwise.

The terminology used herein is for the purpose of describing particular embodiments only and is not intended to be limiting of the present invention.

As used herein, singular forms are intended to include the plural forms and vice versa, unless the context clearly indicates otherwise. The articles 'a' and 'an' as used in this application and the appended claims should generally be construed to mean 'one or more' unless specified otherwise or clear from context to be directed to a singular form.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art, and should not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a television (TV), a projector and the like.

The memory system 110 may operate or perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled to the host 102, according to a protocol of a host interface. Non-limiting examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as, for example, a dynamic random access memory (DRAM) and a static RAM (SRAM) and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory.

The memory system 110 may include a controller 130 and a memory device 150. The memory device 150 may store data to be accessed by the host 102, and the controller 130 may control storage of data in the memory device 150.

The controller 130 and the memory device 150 may be integrated into a single semiconductor device, which may be included in the various types of memory systems as exemplified above.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while an electrical power is not supplied. The memory device 150 may store data provided from the host 102 through a write operation, and provide data stored therein to the host 102 through a read operation. The memory device 150 may include a plurality of memory blocks 152, and each of the memory blocks may include a plurality of pages. Each of the plurality of pages may include a plurality of memory cells to which a plurality of word lines (WL) are electrically coupled.

The controller 130 may control overall operations of the memory device 150, such as read, write, program, and erase operations. For example, the controller 130 may control the memory device 150 in response to a request from the host 102. The controller 130 may provide the data, read from the memory device 150, to the host 102, and/or may store the data, provided by the host 102, into the memory device 150.

The controller 130 may include a host interface (I/F) 132, a processor 134, a memory interface (I/F) 142 and a memory 144 all operatively coupled via an internal bus.

The host interface 132 may process commands and data provided from the host 102, and may communicate with the host 102 through at least one of various interface protocols such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE).

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134, in a case when the memory device 150 is a flash memory such as a NAND flash memory.

The memory 144 may serve as a working memory for the memory system 110 and the controller 130, and may store temporary or transactional data for operating or driving the memory system 110 and the controller 130. The controller 130 may control the memory device 150 in response to a request from the host 102. The controller 130 may deliver data read from the memory device 150 into the host 102, may store data entered through the host 102 within the memory device 150. The memory 144 may be used to store data required for the controller 130 and the memory device 150 in order to perform these operations.

The memory 144 may be implemented with a volatile memory. For example, the memory 144 may be implemented with a static random access memory (SRAM) or a dynamic random access memory (DRAM). Although FIG. 1 exemplifies the memory 144 disposed within the controller 130, the disclosure is not limited thereto. That is, the memory 144 may be located inside or outside the controller 130. For instance, the memory 144 may be embodied by an external volatile memory having a memory interface transferring data and/or signals transferred between the memory 144 and the controller 130.

Further, the memory 144 may store an erase count list 146 loaded from the memory device 150 under the control of the processor 134. The erase count list 146 may include a cumulative number of erase operations on each of the plurality of memory blocks included in the memory device 150. Hereinafter, the cumulative number of erase operations may also be referred to as a first erase count.

In addition, the memory 144 may store a victim block erase count list 148 generated by the processor 134. The victim block erase count list 148 may include fields of an index indicating a selection order of victim blocks, which are selected by the processor 134, identification of the victim blocks, and the first erase counts of the victim blocks at the time of the selection. Hereinafter, the first erase counts of the victim blocks at the time of the selection may also be referred to as a second erase count.

The processor 134 may be implemented with a microprocessor or a central processing unit (CPU). The memory system 110 may include one or more processors 134.

The processor 134 may control entire operations of the memory system 110, and control a program or read operation on the memory device 150 in response to a write or read request of the host 102.

In accordance with an embodiment of the present invention, the processor 134 may count the first erase count of each of the memory blocks included in the memory device 150. Particularly, the processor 134 may count the cumulative number of erase operations for each of the memory blocks whenever an erase operation is performed in the memory device 150. The processor 134 may update the erase count list 146 to reflect the first erase count of each of the memory blocks. The processor 134 may store the erase count list 146 in the memory 144. Further, the erase count list 146 may be stored in the memory device 150 under the control of the processor 134. For example, the erase count list 146 may be stored in the memory device 150 under the control of the processor 134 when the system is terminated. Alternatively, the erase count list 146 may be stored in the memory device 150 at predetermined periods under the control of the processor 134. The processor 134 may load the erase count list 146 stored in the memory device 150 into the memory 144 when the system is booted.

In addition, the processor 134 may select a victim block from the plurality of memory blocks included in the memory device 150. For example, the processor 134 may select, as the victim block, a memory block whose read count is equal to or greater than a predetermined threshold value among the plurality of memory blocks. As another example, the processor 134 may select, as the victim block, a memory block having fail bits of which the number is equal to or greater than a predetermined threshold value. As another example, the processor 134 may select, as the victim block, a memory block that may be subjected to a wear-leveling operation. Specifically, the processor 134 may select, as the victim block, a memory block of which the erase count may trigger the wear-leveling operation. As another example, the processor 134 may select, as the victim block, a memory block in which data was being programmed at a time of a sudden power-off (SPO).

The processor 134 may generate the victim block erase count list 148 for the selected victim block. The processor 134 may update the victim block erase count list 148 in order to reflect information of the selected victim block into the victim block erase count list 148 whenever the victim block is selected. Further, the processor 134 may store the victim block erase count list 148 in the memory 144.

Moreover, the processor 134 may move the data stored in the victim block to a normal block, based on the erase count list 146 and victim block erase count list 148 stored in the memory 144. For example, the processor 134 may move the data to the normal block during garbage collection operation. The normal block refers to a memory block which is not selected as the victim block among the plurality of memory blocks. Particularly, the processor 134 may forcibly move the data stored in the victim block to the normal block according to the indexes of the victim blocks (i.e., the recordation order of the victim blocks) in the victim block erase count list 148.

Specifically, the processor 134 may compare the first erase count of a target victim block recorded in the erase count list 146 with the second erase count of the target victim block recorded in the victim block erase count list 148. In order to determine whether operation of moving data stored in a victim block to a normal block is necessary, the processor 134 may detect the victim block as the target victim block. When the first erase count is different from the second erase count, the processor 134 may not forcibly move the data stored in the target victim block to the normal block. For a victim block, the first erase count may be different from the second erase count when a subsequent erase operation is performed one or more times on that victim block after the information of that victim block is reflected in the victim block erase count list 148. As described above, the first erase count of that victim block may be the cumulative number of erase operations on that victim block and may be updated whenever an erase operation is performed on that victim block. Also as described above, the second erase count may be the first erase counts of the victim blocks at the time when that victim block is selected. For a victim block, the first erase count may be greater than the second erase count when the first erase count is different from the second erase count. When the first erase count is different from the second erase count, a subsequent erase operation must have been performed one or more times on that victim block after that victim block was selected and thus a garbage collection operation need not be performed on that victim block. Subsequently, the processor 134 may delete the information on the target victim block recorded in the victim block erase count list 148.

On the other hand, when the first erase count is equal to the second erase count, the processor 134 may forcibly move the data stored in the target victim block to the normal block. In other words, the processor 134 may copy the data stored in the target victim block and temporarily store the data in the memory 144, and then program the data temporarily stored in the memory 144 into the normal block. Particularly, the processor 134 may forcibly move the data stored in the victim block to a free block among normal blocks. For a victim block, the first erase count may be equal to the second erase count when any subsequent erase operation is not performed on that victim block after the information of that victim block is reflected in the victim block erase count list 148. When the first erase count is equal to the second erase count, any subsequent erase operation cannot have been performed on that victim block after that victim block was selected and thus a garbage collection operation needs to be performed on that victim block. Subsequently, the processor 134 may delete information on the target victim block, recorded in the victim block erase count list 148.

And, the controller 130 may further include an error correction code (ECC) component (not shown) and a power management unit (not shown).

The ECC component may detect and correct errors in the data read from the memory device 150 during the read operation. When the number of the error bits is greater than or equal to a threshold number of correctable error bits, the ECC component may not correct error bits but may output an error correction fail signal indicating failure in correcting the error bits.

The ECC component may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC component may include all or some of circuits, modules, systems or devices for performing the error correction operation based on at least one of the above described codes.

The PMU may provide and manage power of the controller 130.

Figure 2:
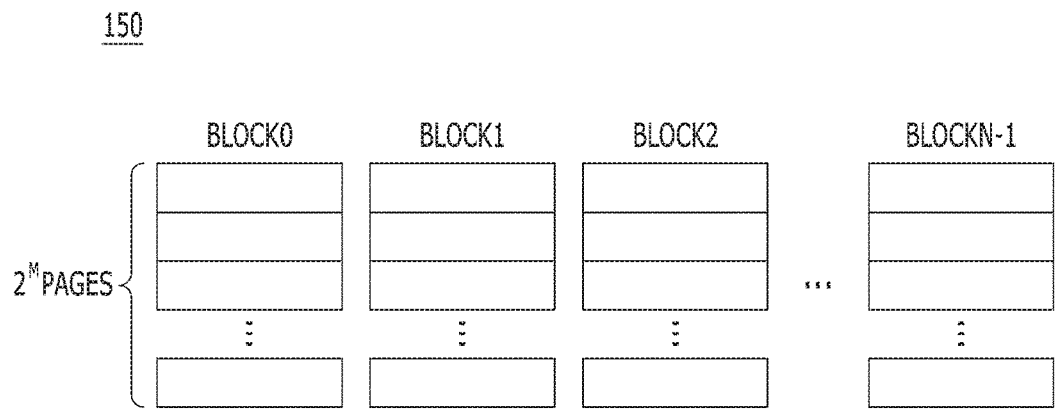
FIG. 2 is a schematic diagram illustrating an example of a configuration of a memory device of the memory system shown in FIG. 1.

FIG. 2 is a schematic diagram illustrating the memory device 150.

Referring to FIG. 2, the memory device 150 may include the plurality of memory blocks BLOCK0 to BLOCKN−1, and each of the blocks BLOCK0 to BLOCKN−1 may include a plurality of pages, for example, $2^M$ pages, the number of which may vary according to circuit design. The memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. An MLC memory block including a plurality of pages which are implemented with memory cells that are each capable of storing 3-bit data may be defined as a triple level cell (TLC) memory block.

Figure 3:
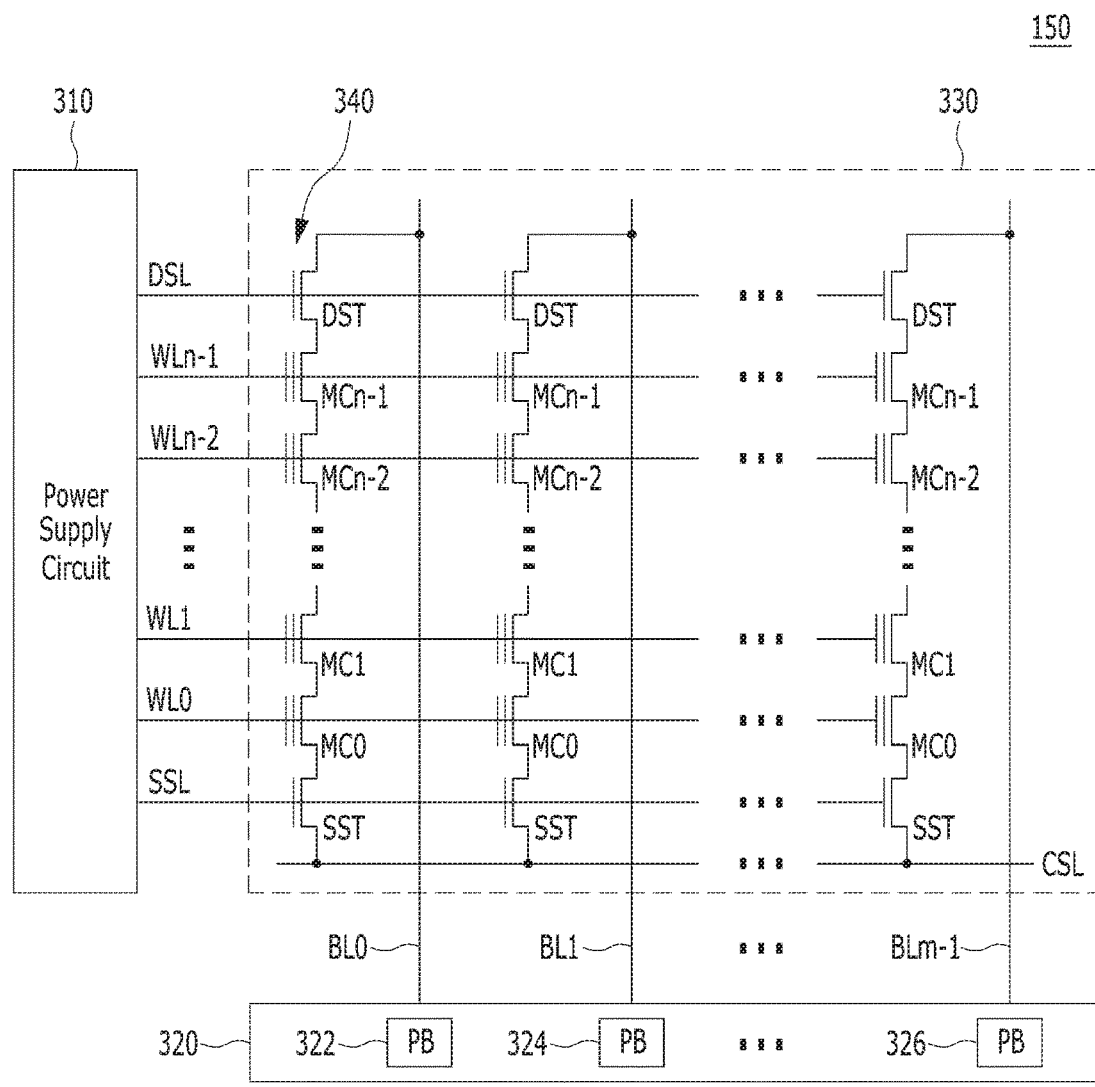
FIG. 3 is a circuit diagram illustrating an example of a configuration of a memory cell array of a memory block in the memory device shown in FIG. 2.

FIG. 3 is a circuit diagram illustrating a memory block 330 in the memory device 150.

Referring to FIG. 3, the memory block 330 may correspond to any of the plurality of memory blocks 152 included in the memory device 150 of the memory system 110.

Referring to FIG. 3, the memory block 330 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by single level cells (SLC) each of which may store 1 bit of information, or by multi-level cells (MLC) each of which may store data information of a plurality of bits. However, the present invention is not limited to just the SLC or MLC. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While FIG. 3 only shows, as an example, that the memory block 330 is constituted with NAND flash memory cells, it is to be noted that the memory block 330 of the memory device 150 according to the embodiment is not limited to a NAND flash memory. For example, the memory block 330 may be realized by a NOR flash memory, a hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

A power supply circuit 310 of the memory device 150 may provide word line voltages, for example, a program voltage, a read voltage, and a pass voltage, to be supplied to respective word lines according to an operation mode and voltages to be supplied to bulks, for example, well regions in which the memory cells are formed. The power supply circuit 310 may perform a voltage generating operation under the control of a control circuit (not shown). The power supply circuit 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read and write (read/write) circuit 320 of the memory device 150 may be controlled by the control circuit, and may serve as a sense amplifier or a write driver according to an operation mode. During a verification operation or a normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
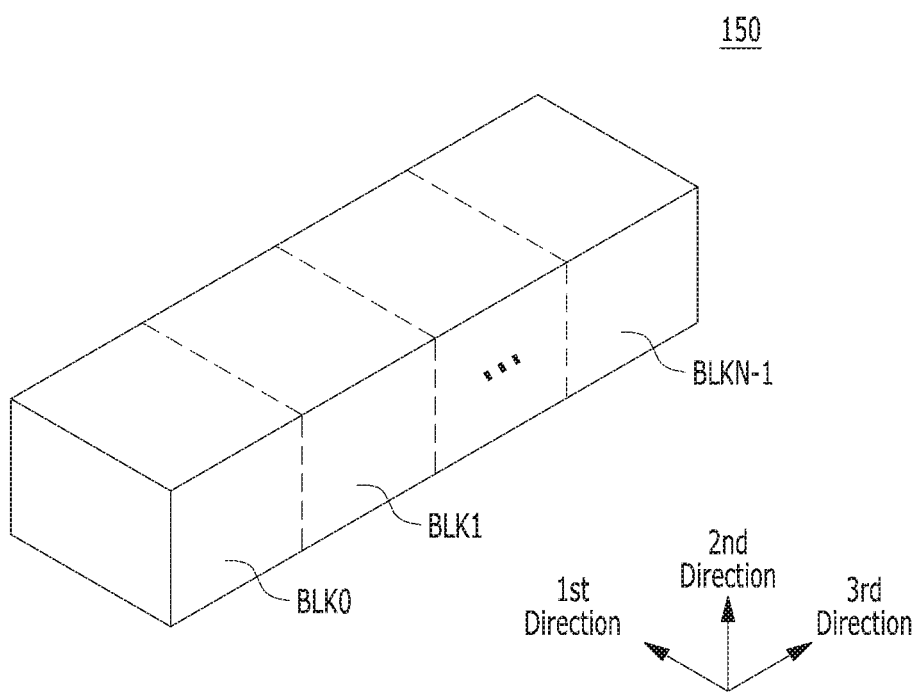
FIG. 4 is a schematic diagram illustrating an example of a three-dimensional (3D) structure of the memory device shown in FIG. 2.

FIG. 4 is a schematic diagram illustrating a 3D structure of the memory device 150.

Although FIG. 4 shows a 3D structure, the memory device 150 may be embodied by a two-dimensional (2D) or three-dimensional (3D) memory device. Specifically, as illustrated in FIG. 3, the memory device 150 may be embodied in a nonvolatile memory device having a 3D stack structure. When the memory device 150 has a 3D structure, the memory device 150 may include a plurality of memory blocks BLK0 to BLKN−1 each having a 3D structure (or a vertical structure).

Figure 5:
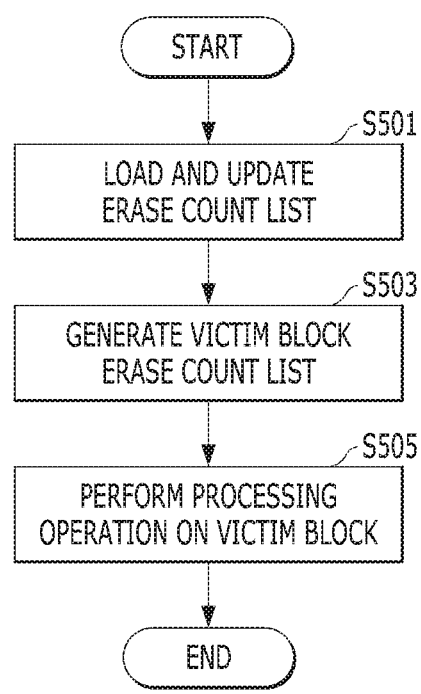
FIG. 5 is a flowchart schematically illustrating an operation of the controller in accordance with an embodiment of the present disclosure.

FIG. 5 is a flowchart schematically illustrating an operation of the controller 130 in accordance with an embodiment. FIG. 5 illustrates only one aspect of an operation of the controller 130.

In step S501, the processor 134 may load the erase count list 146 stored in the memory device 150 into the memory 144. Particularly, the processor 134 may load the erase count list 146 from the memory device 150 and store the loaded erase count list 146 in the memory 144 when the system is booted. The processor 134 may also update the erase count list 146 whenever an erase operation is performed on each of the plurality of memory blocks included in the memory device 150.

In step S503, the processor 134 may generate the victim block erase count list 148. The operation of generating the victim block erase count list 148 is described below in detail with reference to in FIGS. 6A to 6D.

In step S505, the processor 134 may perform a processing operation on the victim block recorded in the victim block erase count list 148. The operation of processing the victim block is described below in detail with reference to in FIGS. 7A and 7B.

Hereinafter, the operation of updating the victim block erase count list 148 in accordance with an embodiment is described in detail with reference to FIGS. 6A to 6D.

Figure 6A:
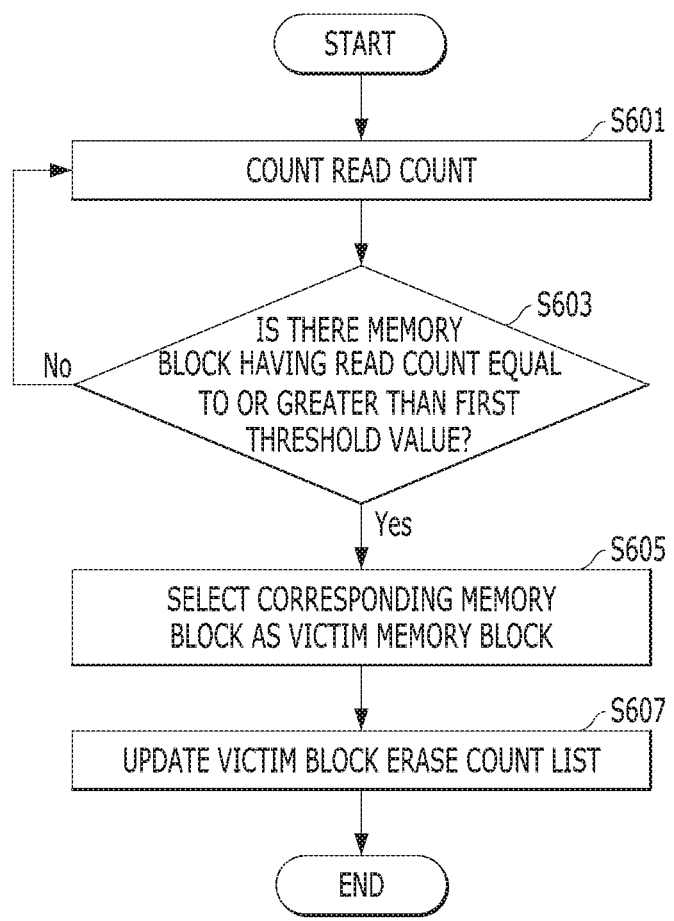
FIG. 6A is a flowchart illustrating an updating process of the victim block erase count list in accordance with an embodiment of the present disclosure.

FIG. 6A is a flowchart illustrating a process of updating the victim block erase count list 148 in accordance with an embodiment. Particularly, FIG. 6A is the flowchart illustrating an operation of the controller 130 to select a victim block for a read reclaim operation.

In step S601, the processor 134 may count a cumulative number of read operations performed on each of the plurality of memory blocks included in the memory device 150 (hereinafter referred to as a read count).

In step S603, the processor 134 may compare the read count with a first threshold value. The first threshold value may be a value triggering the read reclaim operation. The processor 134 may search for a memory block having the read count equal to or greater than the first threshold value.

When there is no memory block having the read count equal to or greater than the first threshold value (that is, "NO" in step S603), the processor 134 may continue to count the read count for each of the memory blocks in step S601.

On the other hand, when there is a memory block having the read count equal to or greater than the first threshold value (that is, "YES" in step S603), the processor 134 may select that memory block as the victim block in step S605.

In step S607, the processor 134 may check the second erase count corresponding to the selected victim block, and update the victim block erase count list 148 to reflect the selected victim block into the victim block erase count list 148.

Figure 6B:
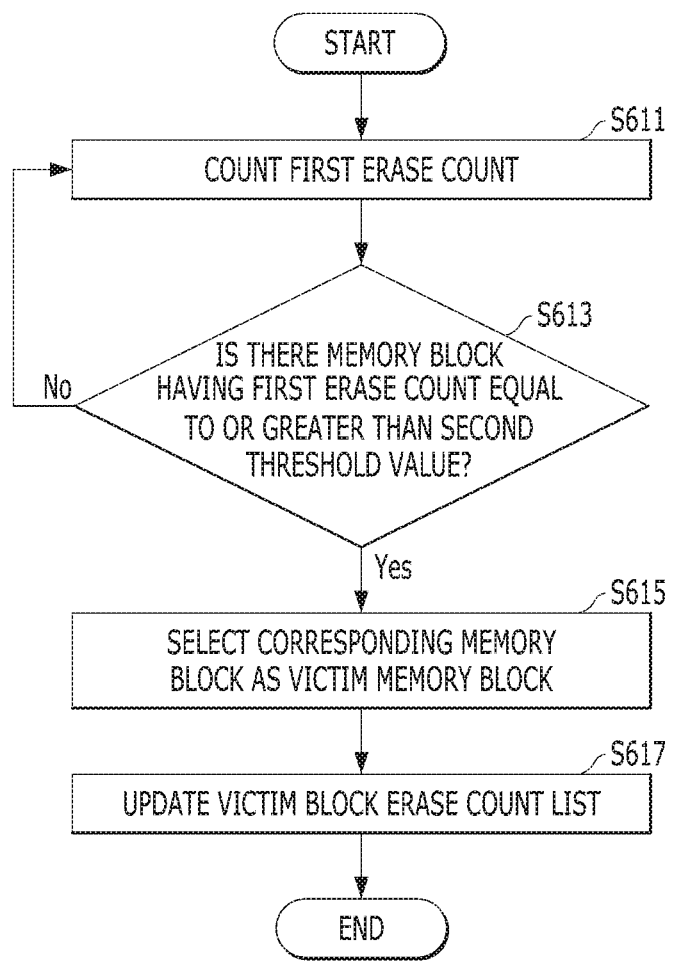
FIG. 6B is a flowchart illustrating a generating process of the victim block erase count list in accordance with an embodiment of the present disclosure.

FIG. 6B is a flowchart illustrating a process of generating the victim block erase count list 148 in accordance with an embodiment. Particularly, FIG. 6B is the flowchart illustrating an operation of the controller 130 to select a victim block for a wear-leveling operation.

In step S611, the processor 134 may count the first erase count for each of the plurality of memory blocks included in the memory device 150.

In step S613, the processor 134 may compare the first erase count with a second threshold value. The second threshold value may be a value triggering the wear-leveling operation. The processor 134 may search for a memory block having the first erase count equal to or greater than the second threshold value.

When there is no memory block having the first erase count equal to or greater than the second threshold value (that is, "NO" in step S613), the processor 134 may continue to count the first erase count for each of the plurality of memory bocks in step S611.

On the other hand, when there is a memory block having the first erase count equal to or greater than the second threshold value (that is, "YES" in step S613), the processor 134 may select the memory block as the victim block in step S615.

In step S617, the processor 134 may check the second erase count corresponding to the selected victim block, and update the victim block erase count list 148 to reflect the selected victim block into the victim block erase count list 148.

Figure 6C:
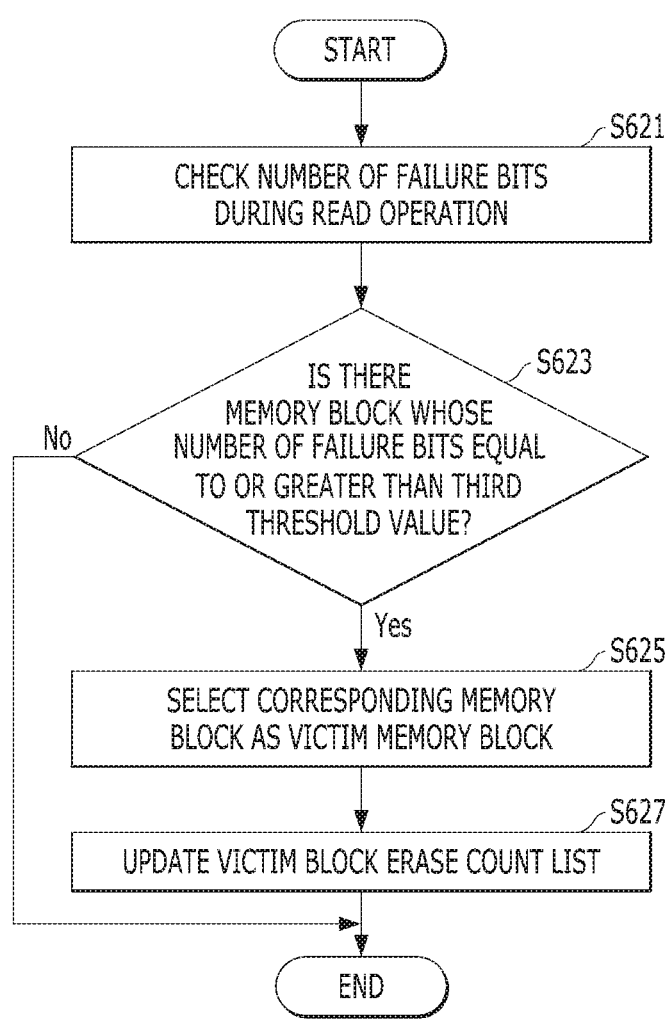
FIG. 6C is a flowchart illustrating a generating process of the victim block erase count list in accordance with an embodiment of the present disclosure.

FIG. 6C is a flowchart illustrating a process of generating the victim block erase count list 148 in accordance with an embodiment. Particularly, FIG. 6C is the flowchart illustrating an operation of the controller 130 to select a victim block according to a number of fail bits included in a memory block.

In step S621, the ECC component 138 may perform a decoding operation on read data during a read operation. Then, the processor 134 may check the number of fail bits detected through the decoding operation.

In step S623, the processor 134 may compare the number of fail bits with a third threshold value. The third threshold value may be a minimum number of fail bits beyond the capacity of the ECC component 138. The ECC component 138 may not be capable of correcting fail bits equal to the third threshold value or greater. The processor 134 may search for the memory block having fail bits of which the number is equal to or greater than the third threshold value, through the comparison.

When there is no memory block having fail bits of which the number is equal to or greater than the third threshold value (that is, "NO" in step S623), the processor 134 may end the current process and may check the number of fail bits during another read operation in step S621.

On the other hand, when there is the memory block having fail bits of which the number is equal to or greater than the third threshold value (that is, "YES" in step S623), the processor 134 may select the memory block as the victim block in step S625.

In step S627, the processor 134 may check the second erase count corresponding to the selected victim block, and update the victim block erase count list 148 to reflect the selected victim block into the victim block erase count list 148.

Figure 6D:
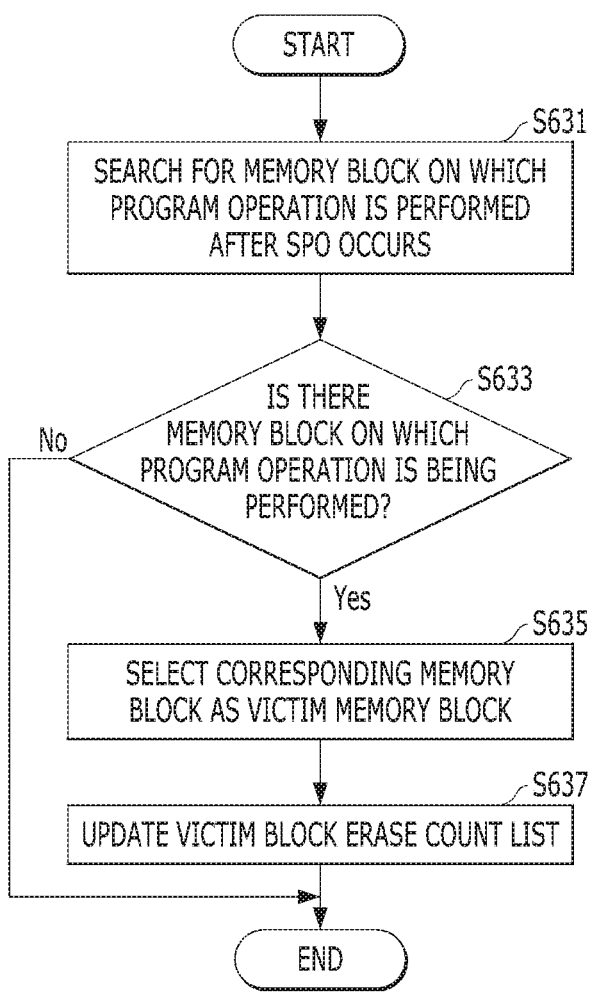
FIG. 6D is a flowchart illustrating a generating process of the victim block erase count list in accordance with an embodiment of the present disclosure.

FIG. 6D is a flowchart illustrating a process of generating the victim block erase count list 148 in accordance with an embodiment. Particularly, FIG. 6D is the flowchart illustrating an operation of the controller 130 to select a victim block according to a sudden power-off recovery (SPOR) operation.

In step S631, in case of a sudden power-off (SPO), the processor 134 may search for a memory block on which a program operation is being performed at the time of the SPO. In other words, the processor 134 may search for a memory block on which the program operation is interrupted due to the SPO. For example, map data corresponding to programmed data may be stored in a memory block on which the program operation is completed. At this time, the processor 134 may determine whether or not the program operation is completed, based on the presence or absence of the map data. However, this is merely an embodiment, and the present invention is not limited thereto.

When there is no memory block on which a program operation is interrupted due to the SPO (that is, "NO" in step S633), the processor 134 may end the process.

On the other hand, when there is the memory block on which the program operation is interrupted due to the SPO (that is, "YES" in step S633), the processor 134 may select the program-interrupted memory block as a victim block in step S635.

In step S637, the processor 134 may check the second erase count corresponding to the selected victim block, and update the victim block erase count list 148 to reflect the selected victim block into the victim block erase count list 148.

FIGS. 6A to 6D are merely embodiments, and the present invention is not limited thereto.

Hereinafter, the operation of processing the victim block based on the updated victim block erase count list 148 in accordance with an embodiment is described with reference to FIGS. 7A and 7B.

Figure 7A:
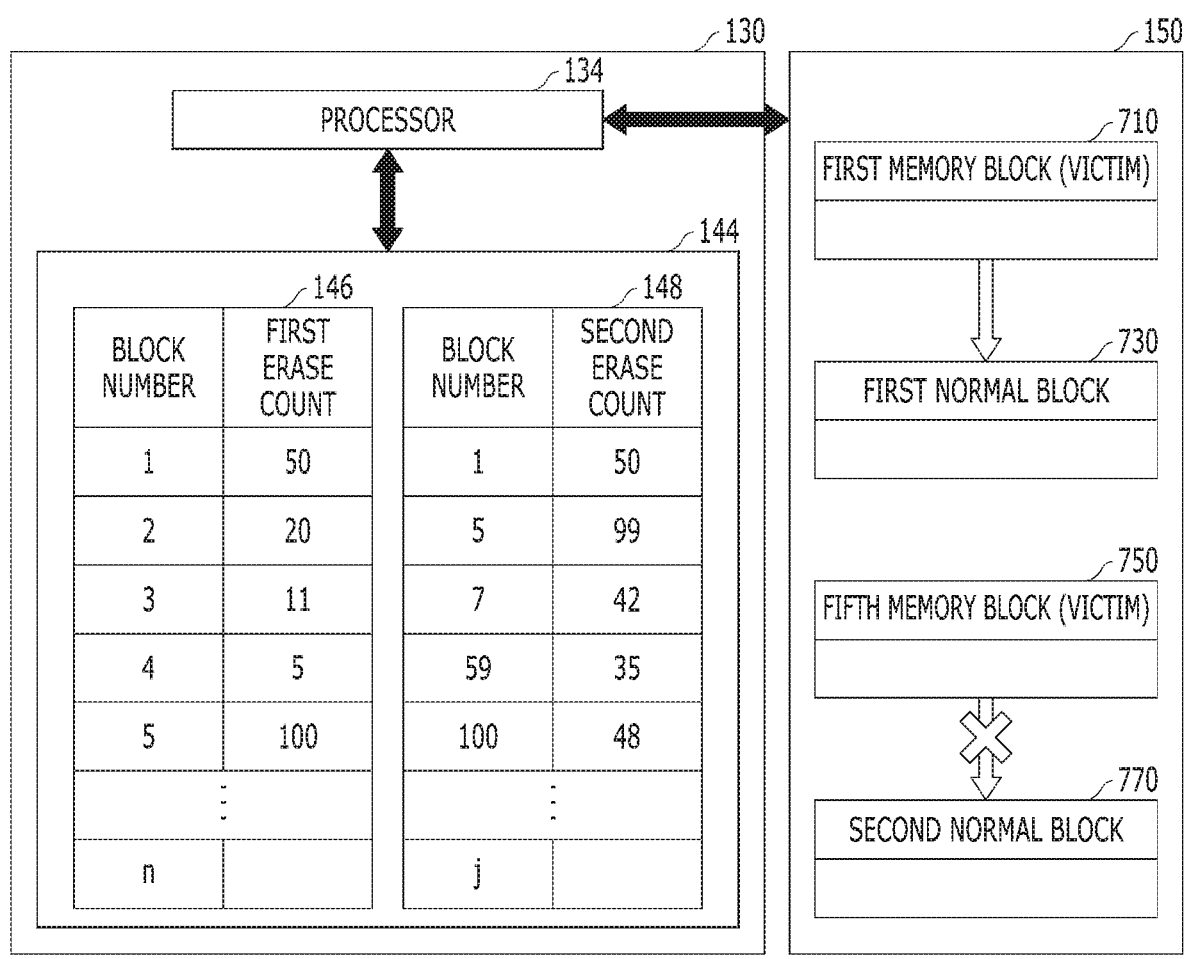
FIG. 7A is a block diagram illustrating the memory system in accordance with an embodiment of the present disclosure.

FIG. 7A illustrates the memory system 110 in accordance with an embodiment. Particularly, only relevant components within the memory system 110 are illustrated in FIG. 7A. Although block numbers recorded in the erase count list 146 and the victim block erase count list 148 of FIG. 7A are represented by simple numbers, the block numbers may include information on channels, dies and planes connected to memory blocks when being implemented in actuality.

As described with reference to FIG. 1, the victim block erase count list 148 may include fields of an index indicating a selection order of the victim blocks, identification (e.g., the block number) of the victim blocks, and the second erase counts (i.e., the first erase counts at the time of the selection) of the victim blocks. The processor 134 may sequentially perform an operation of forcibly moving data from the first indexed victim block within the victim block erase count list 148.

As exemplified in FIG. 7A, the processor 134 may check a first memory block 710, which is the victim block of the first index within the victim block erase count list 148. The first memory block 710 has the block number '1' and the second erase count '50' within the victim block erase count list 148. The processor 134 may search the erase count list 146 for the first memory block 710 having the block number '1', and check the first erase count of the first memory block 710. Subsequently, the processor 134 may compare the first erase count with the second erase count of the first memory block 710. The first erase count of the first memory block 710 having the block number '1' is '50', which is equal to the second erase count '50' of the first memory block 710. The processor 134 may forcibly move data from the first memory block 710 to a first normal block 730 during a garbage collection operation because the first erase count is equal to the second erase count. Then the processor 134 may delete the entry of the first memory block 710 from the victim block erase count list 148.

Subsequently, the processor 134 may check a fifth memory block 750, which is the victim block of a second index within the victim block erase count list 148. The fifth memory block 750 has the number '5' and the second erase count '99' within the victim block erase count list 148. The processor 134 may search the erase count list 146 for the fifth memory block 750 having the block number '5', and check the first erase count of the fifth memory block 750. Subsequently, the processor 134 may compare the first erase count with the second erase count of the fifth memory block 750. The first erase count of the fifth memory block 750 is '100', which is different from the second erase count '99' of the fifth memory block 750. The processor 134 may not forcibly move data from the fifth memory block 750 to a second normal block 770 during a garbage collection operation because the first erase count is different from the second erase count. The processor 134 may delete the entry of the fifth memory block 750 from the victim block erase count list 148.

Figure 7B:
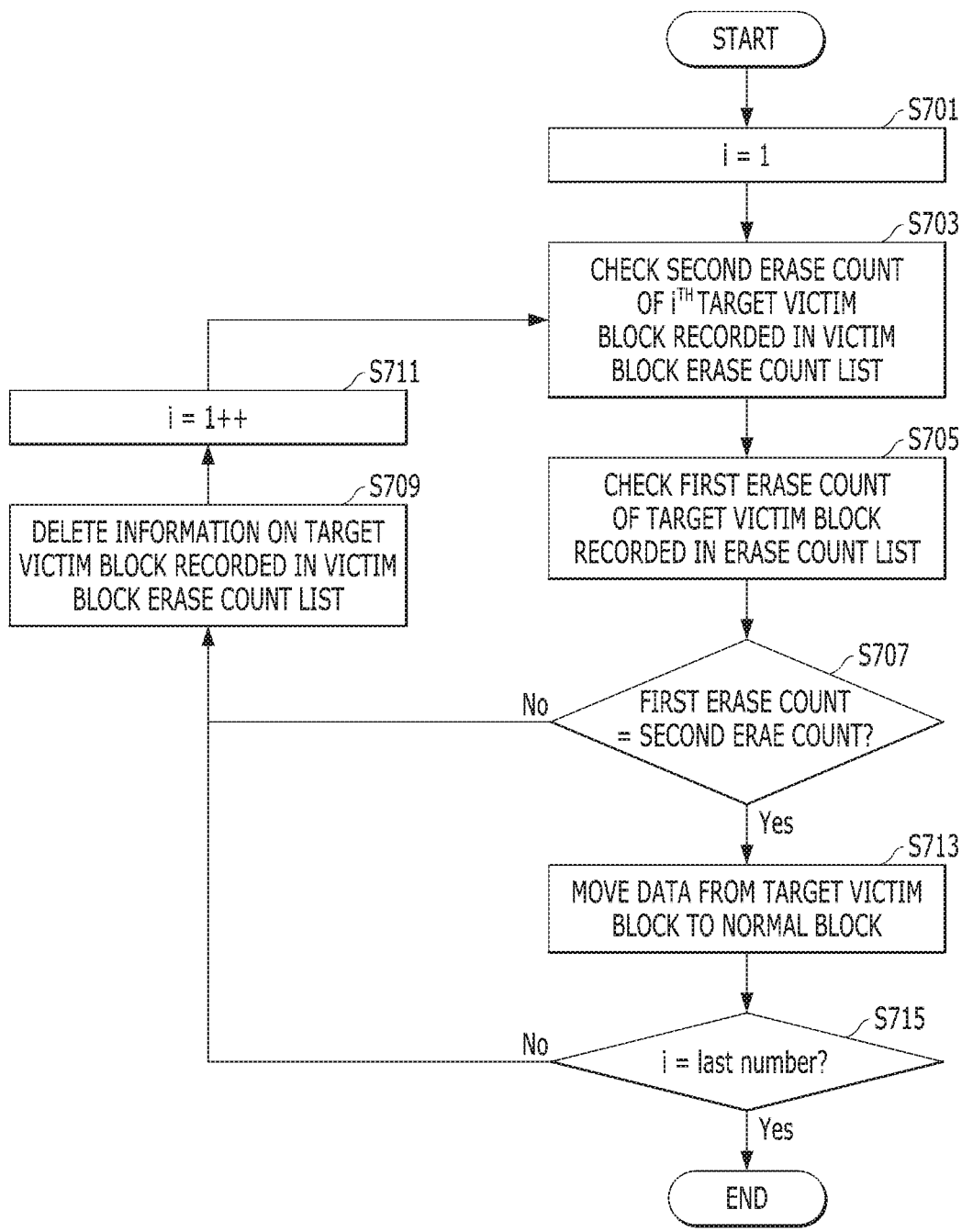
FIG. 7B is a flowchart illustrating an operation of the controller in accordance with an embodiment.

FIG. 7B is a flowchart illustrating an operation of the controller 130 in accordance with an embodiment.

In step S701, an initial value of the index of the victim block erase count list 148 may be set. For example, in the embodiment shown in FIG. 7B, the initial value is set to 1 (i.e., i=1).

In step S703, the processor 134 may check the second erase count of an $i^{th}$ target victim block within the victim block erase count list 148.

In step S705, the processor 134 may check the first erase count of the $i^{th}$ target victim block within the erase count list 146.

In step S707, the processor 134 may compare the first erase count with the second erase count of the $i^{th}$ target victim block.

When the first erase count is different from the second erase count (that is, "NO" in step S707), the processor 134 may delete the entry of the $i^{th}$ target victim block from the victim block erase count list 148, in step S709. The processor 134 may increase the value of "i" by '1' in step S711, and perform the operations of steps S703 to S707 again.

On the other hand, when the first erase count is equal to the second erase count (that is, "YES" in step S707), the processor 134 may move data from the $i^{th}$ target victim block to a normal block in step S713.

In step S715, the processor 134 may check whether or not the entry of the to-be-checked victim block remains within the victim block erase count list 148.

When the entry of the to-be-checked victim block remains within the victim block erase count list 148 (that is, "NO" in step S715), the processor 134 may delete the entry of the $i^{th}$ victim block from the victim block erase count list 148 in step S709. In step S711, the processor 134 may increase the value of "i" by '1', and perform the operations of steps S703 to S707 again.

When any to-be-checked victim block does not remain within the victim block erase count list 148 (that is, "YES" in step S715), the processor 134 may end the process.

As described above, the memory system 110 in accordance with the embodiments may efficiently manage data by managing the current erase count of each of the memory blocks and the erase count at the time when the memory block is selected as a victim block. Particularly, by managing two erase count lists, the memory system 110 may not perform an unnecessary garbage collection operation on a memory block on which an erase operation has already been performed. As a result, the memory system 110 may not perform unnecessary read and erase operations on a target memory block, thereby preventing a read disturbance to the target memory block and extending a lifespan thereof. In other words, the memory system 110 may not perform unnecessary erase and data move operations, thereby improving the performance thereof.

Hereinafter, a data processing system and electronic devices which may be implemented with the memory system 110 including the memory device 150 and the controller 130, which have been described with reference to FIGS. 1 to 7, will be described in detail with reference to FIGS. 8 to 16.

FIGS. 8 to 16 are diagrams schematically illustrating application examples of the data processing system of FIGS. 1 to 7 according to various embodiments.

Figure 8:
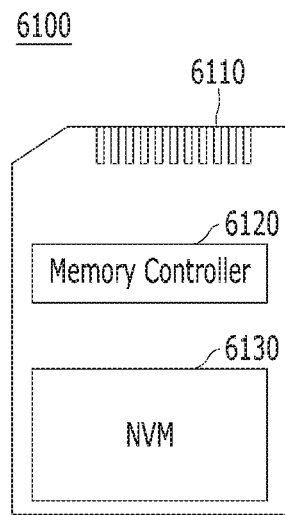
FIGS. 8 to 16 are diagrams schematically illustrating application examples of a data processing system, in accordance with various embodiments of the present invention.

FIG. 8 is a diagram schematically illustrating an example of the data processing system including the memory system in accordance with an embodiment. FIG. 8 schematically illustrates a memory card system 6100 including the memory system in accordance with an embodiment.

Referring to FIG. 8, the memory card system 6100 may include a memory controller 6120, a memory device 6130 and a connector 6110.

More specifically, the memory controller 6120 may be connected to the memory device 6130, and may be configured to access the memory device 6130. The memory device 6130 may be embodied by a nonvolatile memory (NVM). By way of example but not limitation, the memory controller 6120 may be configured to control read, write, erase, and background operations onto the memory device 6130. The memory controller 6120 may be configured to provide an interface between the memory device 6130 and a host (not shown) and/or a drive firmware for controlling the memory device 6130. That is, the memory controller 6120 may correspond to the controller 130 in the memory system 110 described with reference to FIGS. 1 to 7, while the memory device 6130 may correspond to the memory device 150 described with reference to FIGS. 1 to 7.

Thus, as shown in FIG. 1, the memory controller 6120 may include a random access memory (RAM), a processor, a host interface, a memory interface, and an error correction code component. The memory controller 130 may further include the elements described in FIG. 1.

The memory controller 6120 may communicate with an external device, for example, the host 102 of FIG. 1 through the connector 6110.

For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system in accordance with an embodiment may be applied to wired and/or wireless electronic devices, particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (e.g., Personal Computer Memory Card International Association (PCMCIA)), a compact flash (CF) card, a smart media card (e.g., SM and SMC), a memory stick, a multimedia card (e.g., MMC, RS-MMC, MMCmicro and eMMC), a secured digital (SD) card (e.g., SD, miniSD, microSD and SDHC) and a universal flash storage (UFS).

Figure 9:
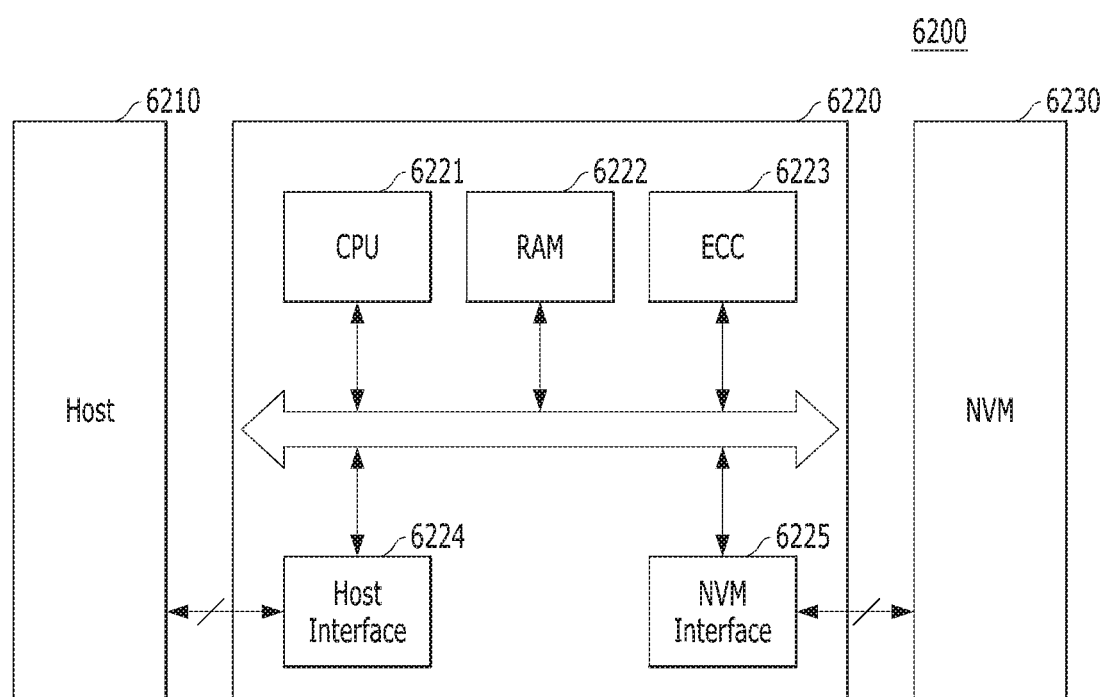

FIG. 9 is a diagram schematically illustrating another example of a data processing system 6200 including a memory system, in accordance with an embodiment.

Referring to FIG. 9, the data processing system 6200 may include a memory device 6230 having one or more nonvolatile memories (NVMs) and a memory controller 6220 for controlling the memory device 6230. The data processing system 6200 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 7, and the memory controller 6220 may correspond to the controller 130 in the memory system 110 described in FIGS. 1 to 7.

The memory controller 6220 may control a read, write, or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory, or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. in this case, the ECC circuit 6223 may correct an error using the parity bit. For example, as described with reference to FIG. 1, the ECC circuit 6223 may correct an error using Low Density Parity Check (LDPC) code, Bose-Chaudhri-Hocquenghem (BCH) code, turbo code, Reed-Solomon code, convolution code, Recursive Systematic Code (RSC) or coded modulation such as Trellis-Coded Modulation (TCM) or Block coded modulation (BCM).

The memory controller 6220 may transmit to, and/or receive from the host 6210, data or signals through the host interface 6224, and may transmit to, and/or receive from the memory device 6230, data or signals through the NVM interface 6225. The host interface 6224 may be connected to the host 6210 through a parallel advanced technology attachment (PATA) bus, a serial advanced technology attachment (SATA) bus, a small computer system interface (SCSI), an universal serial bus (USB), a peripheral component interconnect-express (PCIe), or a NAND interface. The memory controller 6220 may have a wireless communication function with a mobile communication protocol such as wireless fidelity (WiFi) or Long Term Evolution (LTE). The memory controller 6220 may be connected to an external device, e.g., the host 6210, or another external device, and then transmit and/or receive data to and/or from the external device. As the memory controller 6220 is configured to communicate with the external device through one or more of various communication protocols, the memory system and the data processing system in accordance with an embodiment may be applied to wired and/or wireless electronic devices, particularly a mobile electronic device.

Figure 10:
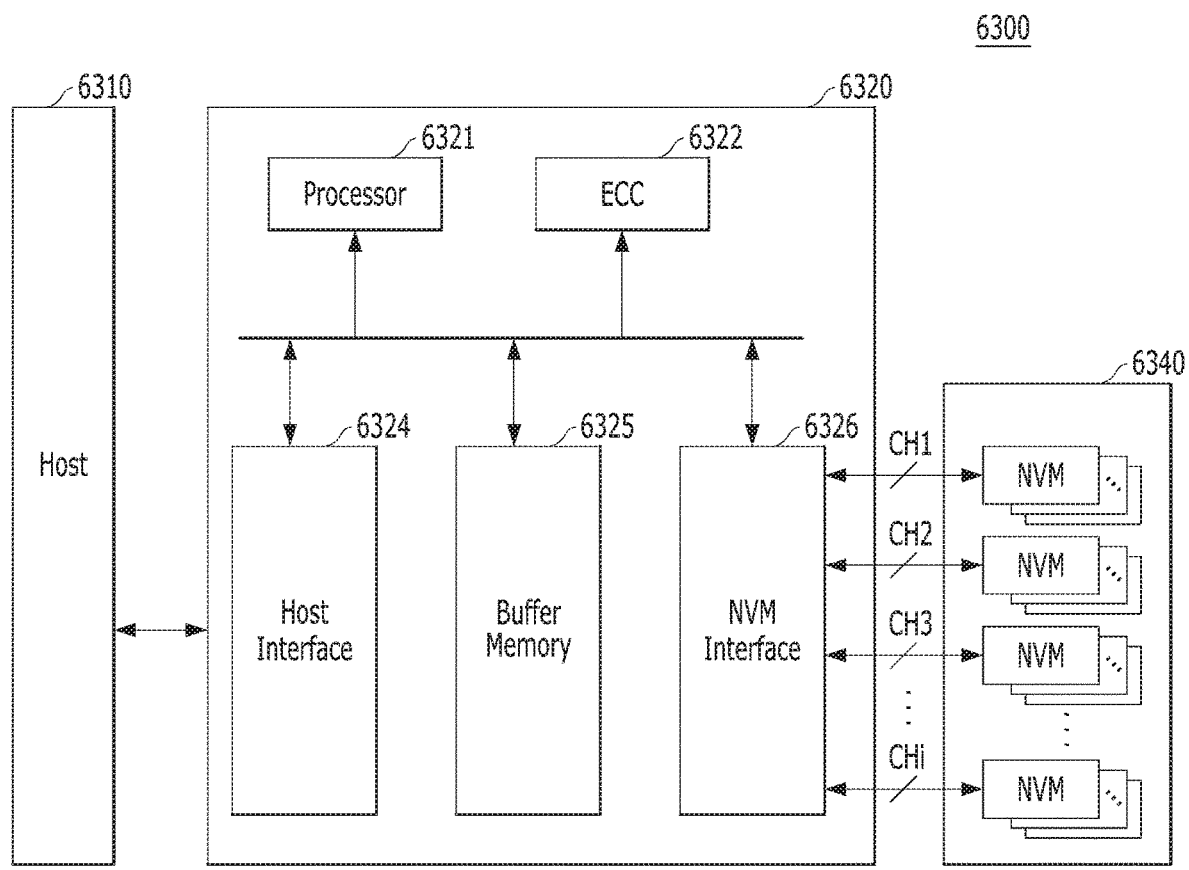

FIG. 10 is a diagram schematically illustrating another example of the data processing system including the memory system in accordance with an embodiment. FIG. 10 schematically illustrates a solid state drive (SSD) to which the memory system in accordance with an embodiment is applied.

Referring to FIG. 10, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

Specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). For the purpose of description, FIG. 10 illustrates that the buffer memory 6325 exists in the controller 6320, but the buffer memory 6325 may be located or arranged outside the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, i.e., RAID level information of the write command provided from the host 6310 in the SSDs 6300, and may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 11:
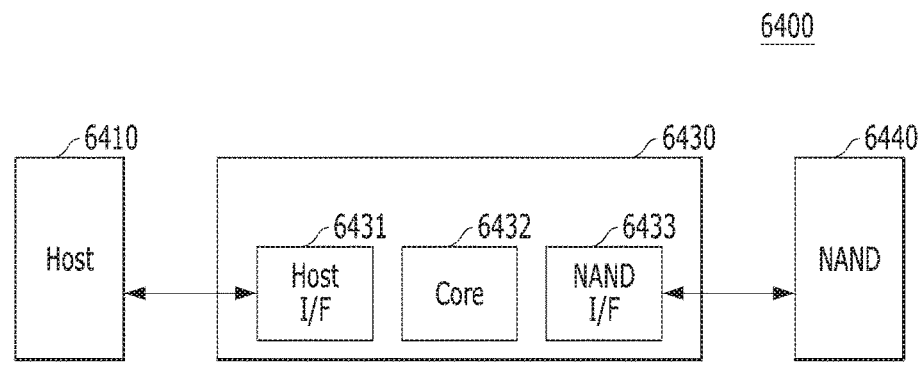

FIG. 11 is a diagram schematically illustrating another example of the data processing system including the memory system in accordance with an embodiment. FIG. 11 schematically illustrates an embedded Multi-Media Card (eMMC) 6400 to which the memory system in accordance with an embodiment is applied.

Referring to FIG. 11, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

Specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control the operations of the eMMC 6400, and the host interface 6431 may provide an interface function between the controller 6430 and the host 6410. The NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 12 to 15 are diagrams schematically illustrating other examples of the data processing system including the memory system in accordance with an embodiment. FIGS. 12 to 15 schematically illustrate universal flash storage (UFS) systems to which the memory system in accordance with an embodiment is applied.

Referring to FIGS. 12 to 15, the UFS systems 6500, 6600, 6700 and 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired and/or wireless electronic devices, particularly mobile electronic devices, and the UFS devices 6520, 6620, 6720, 6820 may serve as embedded UFS devices. The UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700 and 6800 may communicate with external devices, e.g., wired and/or wireless electronic devices, particularly mobile electronic devices through UFS protocols. The UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 9 to 11, and the UFS cards 6530, 6630, 6730, 6830 may be embodied in the form of the memory card system 6100 described with reference to FIG. 8.

Furthermore, in the UFS systems 6500, 6600, 6700 and 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through various protocols other than the UFS protocol, e.g., universal storage bus (USB) Flash Drives (UFDs), multi-media card (MMC), secure digital (SD), mini-SD, and micro-SD.

Figure 12:
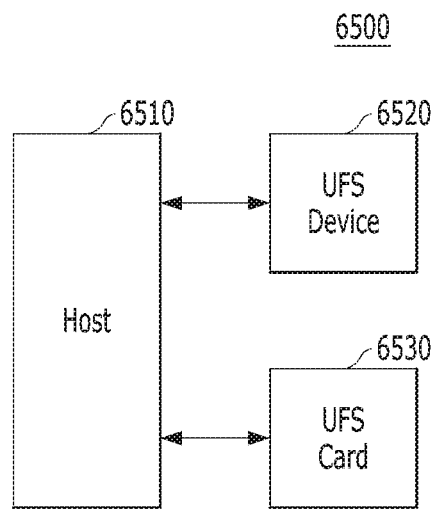

In the UFS system 6500 illustrated in FIG. 12, each of the host 6510, the UFS device 6520 and the UFS card 6530 may include UniPro. The host 6510 may perform a switching operation to communicate with at least one of the UFS device 6520 and the UFS card 6530. The host 6510 may communicate with the UFS device 6520 or the UFS card 6530 through link layer switching, e.g., L3 switching at the UniPro. In this case, the UFS device 6520 and the UFS card 6530 may communicate with each other through a link layer switching at the UniPro of the host 6510. In an example, the configuration in which one UFS device 6520 and one UFS card 6530 are connected to the host 6510 has been exemplified for convenience of description. However, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520. Herein, the form of a star means an arrangement that a single device is coupled with plural other devices or cards for centralized control.

Figure 13:
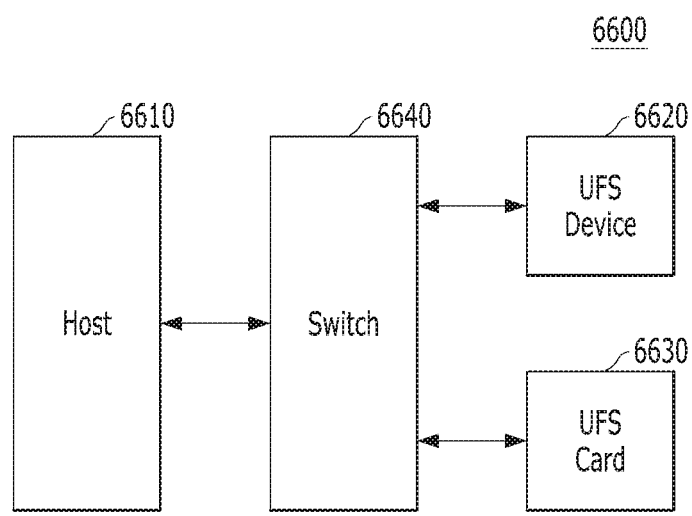

In the UFS system 6600 illustrated in FIG. 13, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an example, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 14:
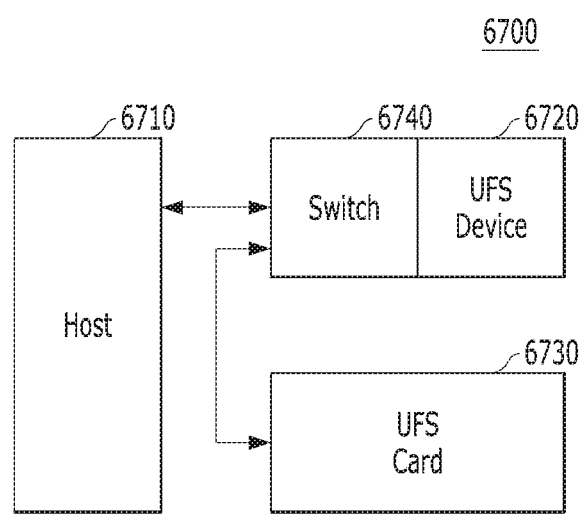

In the UFS system 6700 illustrated in FIG. 14, each of the host 6710, the UFS device 6720 and the UFS card 6730 may include UniPro. The host 6710 may communicate with the UFS device 6720 or the UFS card 6730 through a switching module 6740 performing a switching operation, for example, the switching module 6740 which performs link layer switching at the UniPro, for example, L3 switching. In this case, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an example, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 15:
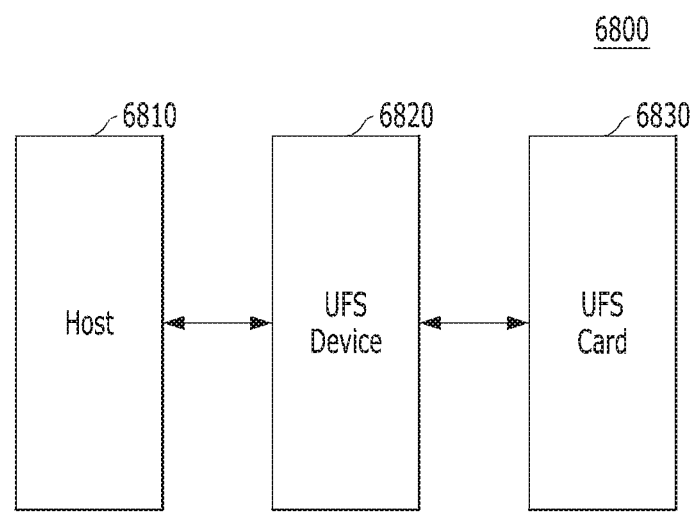

In the UFS system 6800 illustrated in FIG. 15, each of the host 6810, the UFS device 6820 and the UFS card 6830 may include M-PHY and UniPro. The UFS device 6820 may perform a switching operation to communicate with the host 6810 and the UFS card 6830. The UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target Identifier (ID) switching operation. Here, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 16:
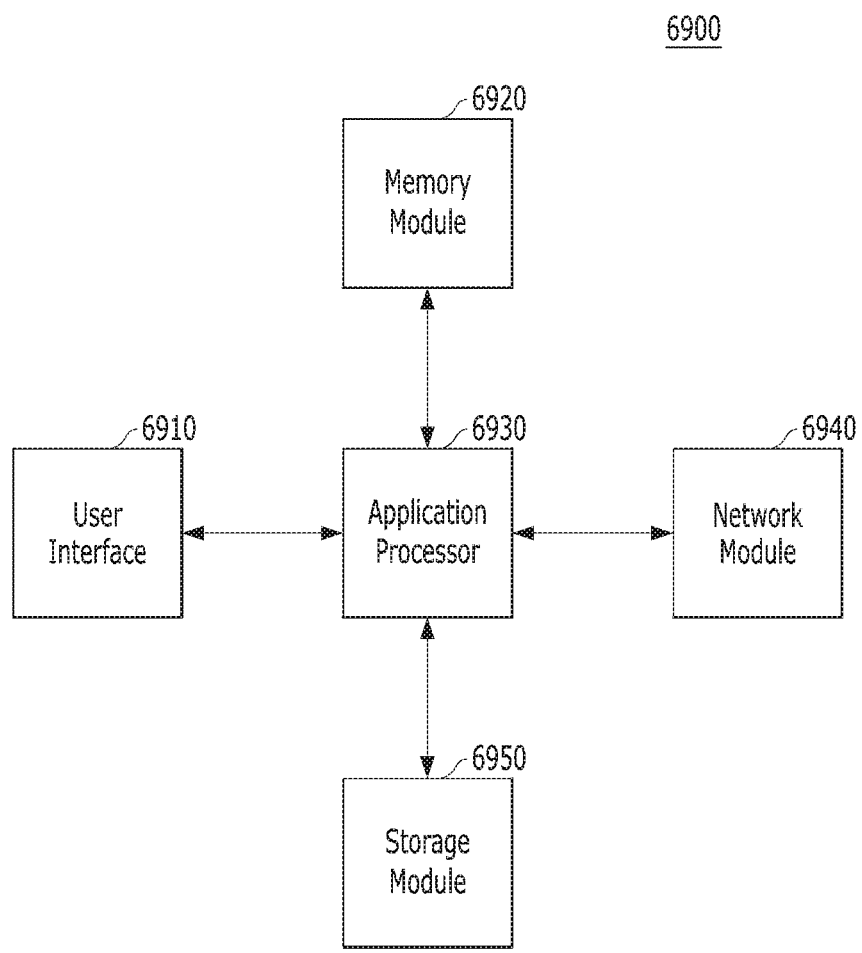

FIG. 16 is a diagram schematically illustrating another example of the data processing system including the memory system in accordance with an embodiment. FIG. 16 is a diagram schematically illustrating a user system 6900 to which the memory system in accordance with an embodiment is applied.

Referring to FIG. 16, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as a System-on-Chip (SoC).

The memory module 6920 may be used as a main memory, work memory, buffer memory, or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 10 to 15.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control the operations of the mobile electronic device, and the network module 6940 may serve as a communication module for controlling wired and/or wireless communication with an external device. The user interface 6910 may display data processed by the processor 6930 on a display and touch module of the mobile electronic device, or support a function of receiving data from the touch panel.

While the present invention has been described with respect to specific embodiments, it will be apparent to those skilled in the art that various changes and modifications may be made without departing from the spirit and scope of the invention as determined in the following claims.

What is claimed is:

1. A memory system comprising:
  a memory device suitable for storing an erase count list where a first erase count of each of a plurality of memory blocks is recorded; and a controller suitable for counting the first erase count of each of the memory blocks, updating the erase count list to reflect the first erase count, selecting victim blocks from the memory blocks, counting the first erase count at the time of the selecting the victim blocks as a second erase count corresponding to each of the victim blocks, updating a victim block erase count list to reflect the second erase count, comparing the first erase count and the second erase count which correspond to a target victim block, which is detected to determine whether operation of moving data in a victim block to a normal block is necessary, among the victim blocks, and moving data stored in the target victim block to the normal block when the first erase count is equal to the second erase count, wherein the first erase count is a cumulative number of erase operations performed on each of the memory blocks up to the present, wherein the second erase count is a cumulative number of erase operations which had been performed on each of the victim blocks until the victim blocks are selected.

2. The memory system of claim 1, wherein the controller includes:

a processor suitable for counting the first erase count of each of the memory blocks, updating the erase count list to reflect the first erase count, selecting the victim blocks from the memory blocks, counting the second erase count corresponding to each of the victim blocks, generating the victim block erase count list to reflect the second erase count, comparing the first erase count and the second erase count which correspond to the target victim block, and moving the data stored in the target victim block to the normal block when the first erase count is equal to the second erase count; and a memory suitable for storing the erase count list and victim block erase count list.

3. The memory system of claim 1, wherein the processor selects the victim blocks, each of which has a read count that is equal to or greater than a threshold value, among the memory blocks.

4. The memory system of claim 1, wherein the processor selects the victim blocks, each of which has a predetermined number of fail bits or greater, among the memory blocks.

5. The memory system of claim 1, wherein the processor selects the victim blocks, each of which has an erase count triggering a wear-leveling operation, among the memory blocks.

6. The memory system of claim 1, wherein the processor selects the victim blocks, on each of which a program operation is interrupted due to a sudden power off (SPO), among the memory blocks.

7. The memory system of claim 1, wherein the erase count list includes a block number of each of the memory blocks and the first erase count corresponding to the block number, wherein the victim block erase count list includes a block number of each of the victim blocks and the second erase count corresponding to the block number.

8. The memory system of claim 1, wherein the processor updates the erase count list whenever the erase operation is performed on each of the memory blocks.

9. The memory system of claim 1, wherein the processor updates the victim block erase count list whenever a victim block is selected from the memory blocks.

10. The memory system of claim 1, wherein, when the system is booted, the processor loads the erase count list from the memory device and stores the loaded erase count list in the memory.

11. An operating method for a memory system including a memory device having an erase count list stored therein and a controller suitable for controlling the memory device, the operating method comprising:

counting a first erase count for each of a plurality of memory blocks;

updating the erase count list such that the first erase count corresponds to each of the memory blocks;

selecting victim blocks from the memory blocks;

counting the first erase count at the time of the selecting the victim blocks as a second erase count corresponding to each of the victim blocks;

updating a victim block erase count list to reflect the second erase count;

comparing the first erase count and the second erase count which correspond to a target victim block, which is detected to determine whether moving data from a victim block to a normal block is necessary, among the victim blocks; and moving data stored in the target victim block to the normal block when the first erase count is equal to the second erase count, wherein the first erase count is a cumulative number of erase operations performed on each of the memory blocks up to the present, wherein the second erase count is a cumulative number of erase operations which had been performed on each of the victim blocks until the victim blocks are selected.

12. The operating method of claim 11, wherein each of the victim blocks has read count equal to or greater than a threshold value.

13. The operating method of claim 11, wherein each of the victim blocks has a predetermined number of fail bits or greater.

14. The operating method of claim 11, wherein each of the victim blocks has an erase count triggering a wear-leveling operation.

15. The operating method of claim 11, wherein each of the victim blocks are memory blocks on each of which a program operation is interrupted due to a sudden power off (SPO).

16. The operating method of claim 11, wherein the erase count list includes a block number of each of the memory blocks and the first erase count corresponding to the block number, wherein the victim block erase count list includes a block number of each of the victim blocks and the second erase count corresponding to the block number.

17. The operating method of claim 11, wherein the updating of the erase count list includes updating the erase count list whenever the erase operation is performed on each of the memory blocks.

18. The operating method of claim 11, wherein the updating of the victim block erase count list includes updating the victim block erase count list whenever a victim block is selected from the memory blocks.

19. The operating method of claim 11, further comprising deleting information on the target victim block recorded in the victim block erase count list after the data stored in the target victim block is moved to the normal block.

20. The operating method of claim 11, further comprising loading the erase count list from the memory device and storing the loaded erase count list in the memory when the system is booted.

* * * * *